United States Patent [19]

Lewyn et al.

[11] Patent Number: 4,926,176
[45] Date of Patent: May 15, 1990

[54] SELF-TIMING ANALOG-TO-DIGITAL CONVERTING SYSTEM

[75] Inventors: Lanny L. Lewyn, Laguna Beach; Perry W. Lou, Carlsbad, both of Calif.

[73] Assignee: Brooktree Corporation, San Diego, Calif.

[21] Appl. No.: 236,505

[22] Filed: Aug. 25, 1988

[51] Int. Cl.$^5$ .............................................. H03M 1/36
[52] U.S. Cl. ..................................... 341/135; 341/136; 341/158; 307/350
[58] Field of Search ............... 341/136, 158, 159, 164, 341/135; 307/350, 362

[56] References Cited

U.S. PATENT DOCUMENTS

| | | | |
|---|---|---|---|
| 4,097,753 | 6/1978 | Cook et al. | 341/165 |
| 4,449,118 | 5/1984 | Dingwall et al. | 341/159 |
| 4,506,171 | 5/1985 | Evans et al. | 307/362 |
| 4,547,683 | 10/1985 | Bingham | 307/350 |
| 4,591,830 | 5/1986 | Hanna | 341/159 |
| 4,675,651 | 6/1987 | Marbot et al. | 341/135 |
| 4,691,189 | 9/1987 | Dingwall et al. | 341/158 |

Primary Examiner—William M. Shoop, Jr.
Assistant Examiner—Gary J. Romano
Attorney, Agent, or Firm—Ellsworth R. Roston; Charles H. Schwartz

[57] ABSTRACT

A substantially constant current is divided between two lines in accordance with the relative values of an input voltage and a reference voltage respectively introduced to such lines. The currents through the first and second lines respectively charge first and second capacitances. The charges in the first and second capacitances respectively control the magnitudes of the currents flowing through first and second control members to charge the first and second capacitances. The control members are interconnected so that any difference between the flow of current through the control members and the associated capacitances between magnified. When the charge in an individual one of the capacitances reaches a particular value, a signal on an output terminal associated with the other capacitance changes from the first magnitude to a second magnitude. During this time, the signal associated with the first capacitance remains at substantially the first magnitude. A plurality of stages, including the comparators discussed above, compare the input voltage with progressive values of the reference voltage. Such stages are connected to successive pairs of comparators to indicate, on the basis of the relative magnitudes of the voltages on the output terminals of such comparators, whether the reference voltage is greater than the input voltage for both comparators in such pairs. A output signal is provided by the plurality only when one pair of comparators provides an output indicating that the input voltage is between the reference voltages connected to that pair of comparators.

20 Claims, 2 Drawing Sheets

SELF-TIMING ANALOG-TO-DIGITAL CONVERTING SYSTEM

This invention relates to flash comparators for use in analog-to-digital converters to indicate an analog value in binary coded form. More particularly, the invention relates to a flash converter for converting an analog value to a binary coded form in a minimal time and with minimal complexity.

Data processing systems have become widespread in only a relatively few years to perform a number of different functions useful in our society. For example, data processing systems have widespread use in industry to regulate various parameters such as temperature and pressures in processes for manufacturing various articles. In such processes, the parameters such as temperatures and pressures are determined on an analog basis. The determinations of these parameters are then converted to binary indications which are processed in the data processing system with determinations of the values of other parameters. The data processing system then produces control signals in binary coded form in accordance with the relative values of the different parameters. These control signals are then converted to corresponding analog signals to regulate the parameters such as temperature and pressure.

In the data processing systems discussed in the previous paragraph, analog-to-digital converters are used to convert into binary coded form the analog signals indicative of the parameters such as temperature and pressure. Some types of these converters compare the magnitude of the analog signal with progressive magnitudes of a reference voltage. The comparisons are made in stages designated as "flash comparators" which determine whether the magnitude of the input voltage at any instant is between progressive magnitudes of the reference voltage. When this determination is made in a particular comparator, binary indications representative of the magnitude of the input voltage are obtained from stages connected to such particular comparator.

The flash comparators now in use have certain serious disadvantages. One primary disadvantage is that the comparators are relatively slow. The slow response of the flash comparators is exacerbated when the magnitude of the input voltage approaches the magnitude of the reference voltage with which it is being compared. For example, response times as great as fifteen (15) times the time constant for the response of the flash comparators are often required. When variations in such parameters as variations in temperature and pressure are considered and when variations in the characteristics of successive circuit chips of the same design are considered, response times as great as thirty (30) times the time constant for the response of the flash comparators are often required. At the end of this period of time, the flash converters are strobed to provide an output indication of the results of the comparison whether or not the flash converters are ready at such a time to provide a proper response.

Even with such a slow response time as discussed in the previous paragraph, flash comparators are still unable at times to provide a definitive indication as to whether the input voltage is greater or less than the reference voltage introduced to such comparators. The flash comparators now in use are accordingly not only slow but are also indefinite at times in their output. This indefinite response occurs sufficiently frequently to pose a problem of producing errors. The flash comparators accordingly constitute an Achilles heel in the operation of the data processing systems with which they are associated.

A considerable effort has been made, and significant amounts of money have been expended, to resolve the problems discussed in the previous paragraphs. For example, flash comparators have been provided in which pre-amplifiers are added to enhance their sensitivity. In spite of such efforts and such expenditures of money, the problems discussed above still remain. Furthermore, in the flash comparators developed after such efforts and money expenditures, the flash comparators provide output responses which are still strobed after some predetermined delay such as thirty (30) times the time constant for the response of the flash comparator.

This invention provides an analog-to-digital converter which includes flash comparators constructed to overcome the disadvantages discussed in the previous paragraphs. For example, the flash comparators operate in a minimal time to indicate whether the magnitude of an input voltage is less than the magnitude of the reference voltage introduced to such comparators. Furthermore, in this minimal response time, the flash comparators provide a more definite and positive indication than in the comparators of the prior art. In providing such a positive indication in such a minimal period of time, the flash converters operate on a non-strobed basis. By operating on a non-strobed basis, the flash comparators provide an output as soon as such output becomes available.

In one embodiment of the invention, a substantially constant current is divided between first and second lines in accordance with the relative values of an input voltage and a reference voltage respectively introduced to such lines. The currents through the first and second lines respectively charge first and second capacitances. The charges in the first and second capacitances respectively control the magnitudes of the currents flowing through first and second control members to charge the first and second capacitances.

The control members are interconnected so that any difference between the flow of current through the control members and the associated capacitances becomes magnified. When the charge in an individual one of the capacitances reaches a particular value, a signal on an output terminal associated with the other capacitance changes from a first magnitude to a second magnitude. During this time, the signal associated with the first capacitance remains at substantially the first magnitude.

A plurality of stages, including the comparators discussed above, compare the input voltage with progressive values of the reference voltage. Successive pairs of such stages are connected to successive pairs of comparators to indicate, on the basis of the relative magnitudes of the voltages on the output terminals of such comparators, whether the reference voltage is greater than the input voltage for both comparators in such pairs. An output signal is produced by the plurality only when one pair of comparators provides an output indicating that the input voltage is between the reference voltages connected to that pair of comparators.

Figure 1:
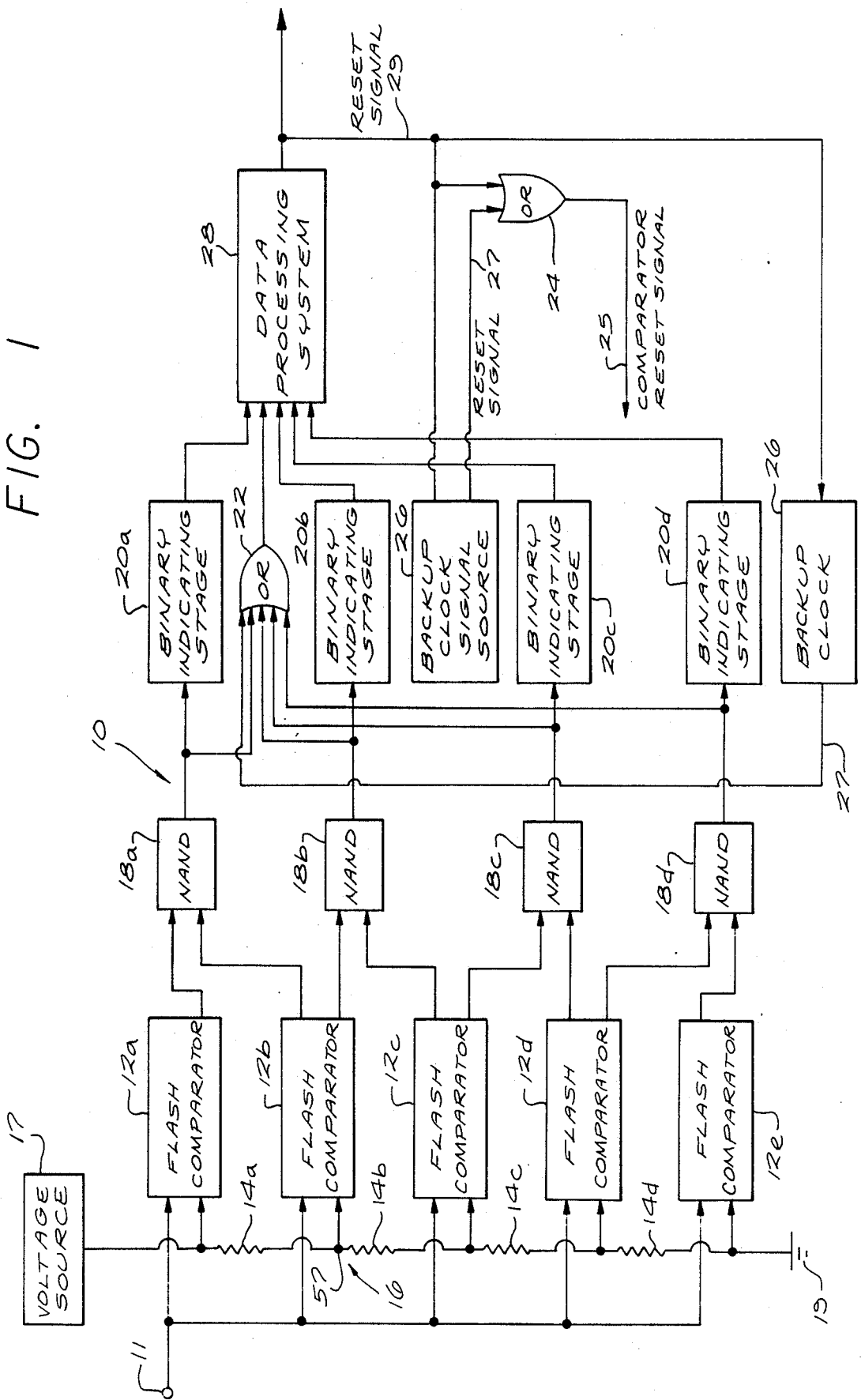
FIG. 1 is a block diagram of an analog-to-digital converter, including a plurality of flash comparators, constructed in accordance with one embodiment of the invention.

In one embodiment, an analog-to-digital converter is generally indicated at 10 in FIG. 1. In this converter, an input voltage is provided on a line 11. The input voltage may be produced in a conventional manner to represent a variable parameter such as temperature or pressure. The input voltage on the line 11 is introduced to first input terminals of a plurality of flash comparators indicated in block form at 12a, 12b, 12c, etc. A reference voltage is also introduced to second input terminals of each of the flash comparators 12a, 12b, 12c, 12d, 12e, etc. to provide a comparison in the relative magnitudes of the input and reference voltages. The reference voltage introduced to each of the successive comparators 12a, 12b, 12c etc. in the sequence has a progressive magnitude relative to the magnitude of the voltages introduced to the preceding comparators in the sequence. These progressive magnitudes in the reference voltage are obtained by providing a plurality of resistances 14a, 14b, 14c, 14d, etc. in series to define a resistance ladder generally indicated at 16 and by connecting one end of the resistance ladder to a voltage source 17 providing a positive voltage such as approximately two volts (2 V) and by connecting the other end of the ladder to a common potential such as a ground 19. The second input terminals of the flash comparators 12a, 12b, 12c, etc. are respectively connected to the terminals common to the resistances 14a and 14b and the resistances 14b and 14c, etc.

Each of the comparators 12a, 12b, 12c, etc. includes two output terminals. The output terminals from progressive pairs of the comparators 12a, 12b, 12c, etc. are connected to "nand" networks 18a, 18b, 18c, 18d, etc. in a particular pattern. For example, the lower output terminal of the comparator 12a and the upper output terminal of the comparator 12b are connected to the "nand" network 18a. Similarly, connections are made to the "nand" network 18b from the lower output terminal of the comparator 12b and the upper output terminal of the comparator 12c.

The outputs from each of the "nand" networks 18a, 18b, 18c, etc., are respectively introduced to associated stages 20a, 20b, 20c, 20d, etc. to obtain binary output indications in a well known manner. The binary outputs are binary words coded to provide a digital representation of the analog value of the input voltage on the line 11. The outputs from the "nand" networks 18a, 18b, 18c, etc. are also introduced to an "or" network 22. The signals from the "or" network 22 pass to a data processing system 28 to indicate to the data processing system that the conversion of the input voltage on the line 11 to binary coded signals representative of such input voltage has been completed.

Each of the flash comparators 12a, 12b, 12c, etc. receives the input voltage on the line 11 and a reference voltage of an individual magnitude from the resistance ladder 16 and compares these voltages. When the input voltage exceeds the reference voltage introduced to the comparator, the comparator produces a voltage of a large magnitude on its upper output terminal and produces a voltage of a low magnitude on its lower output terminal. The comparator produces a voltage of a low magnitude on its upper output terminal and a voltage of a high magnitude on its lower output terminal when the input voltage is less than the reference voltage.

The "nand" networks 18a, 18b, 18c, etc., respectively compare voltages on the opposite terminals of successive pairs of comparators 12a, 12b, 12c, etc. to determine the magnitude of the input voltage relative to the progressive magnitudes of the reference voltages from such successive pairs of comparators. Only one of the "nand" networks 18a, 18b, 18c, etc., is able to pass an output signal at any one time. For example, the "nand" network 18b may pass an output signal. This indicates that the input voltage on the line 11 has a magnitude between the reference voltages on the terminal common to the resistances 14a and 14b and the terminal common to the resistances 14b and 14c.

When a signal passes through one of the "nand" networks such as the "nand" network 18b, it causes a plurality of binary signals to be produced by a particular one of the stages 20a, 20b, 20c, etc. These signals indicate in binary coded form a reference voltage midway between a pair of flash comparators such as the comparators 12b and 12c. The signal from the activated "nand" network such as the network 18b also passes through the "or" network 22 to the data processing system 28 to activate the data processing system to receive the binary coded signals from the activated one of the binary indicating stages such as the stage 20b. The data processing system 28 then processes these signals and signals representing other parameters and produces signals which cause controls to be operated for regulating such parameters as temperature and pressure. When the controls for such parameter as temperature are regulated, the magnitude of the analog signal on the line 11 may be subsequently changed.

Once the conversion of the input voltage has been completed and the data processing system has been activated by the output of the "or" network 22, the data processing system may then generate on a line 29 a reset signal which passes through an "or" network 24, resulting finally in a reset signal on a line 25. This comparator reset signal causes switches 68, 70, 82 and 84 in all comparators (See FIG. 2) to close in preparation for another input signal. At the end of the reset signal 25, another conversion cycle will begin.

The connections described above will cause conversion cycles to be repeated rapidly, with a timing pattern controlled primarily by the output of the "or" network 22. This output indicates that all comparators have resolved (produced a definite output). In some systems, it may be desirable to add a backup clock 26 to generate a reset signal on a line 27. This reset signal then forces the "or" network 24 to generate the comparator reset signal on the line 25. It can then be seen that the backup clock 26 acts to force the plurality of comparators to be reset and then convert another input signal if the comparators have not resolved, and if no output from the "or" network 22 has been produced, within a predetermined period of time. Such time period may be begun by resetting the backup clock 26 with the reset signal which resulted on the line 29 from the last signal to be resolved by the comparators. The backup clock 26 should be free-running so that the reset signal on the line 29 is not required to initiate more than one comparator reset signal. A free-running clock therefore prevents the system from locking up in the rare case that more than one successive input comparison remains unresolved.

Figures 2, 3:
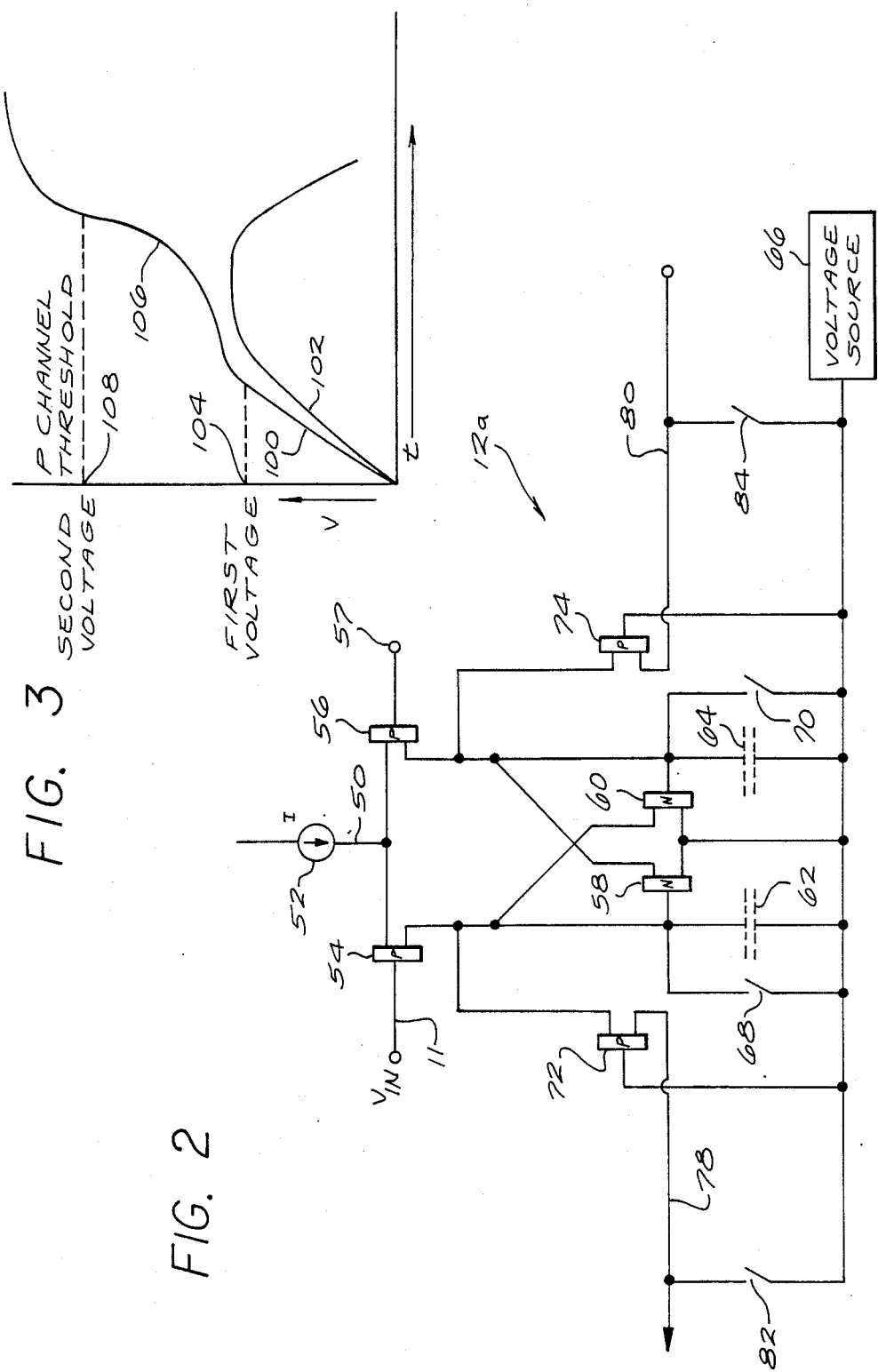
FIG. 2 is a somewhat detailed circuit diagram showing the construction of one of the flash comparators shown in FIG. 1.
FIG. 3 illustrates waveforms of voltages produced at strategic terminals in the flash comparator shown in FIG. 2.

FIG. 2 illustrates in some detail electrical circuitry defining one of the flash comparators such as the comparator 12a. It will be appreciated that similar circuitry may be provided for each of the other flash comparators such as the comparators 12b, 12c, etc. In the embodiment of the flash comparator shown in FIG. 2, a constant current is produced on a line 50 by a source 52. The current on the line 50 passes to the sources of a pair of transistors such as transistors 54 and 56. The transistors 54 and 56 are preferably of the p-type (indicated by the letter "p" within a block designating each transistor). The gates of the transistors 54 and 56 respectively receive the input voltage on the line 11 and the reference voltage on one of the terminals in the resistance ladder 16 such as a terminal 57 (FIGS. 1 and 2) common to the resistances 14b and 14c.

The drains of the transistors 54 and 56 are respectively common with the gates of transistors 58 and 60, both of which may be of the n-type (indicated by the letter "n" within a block designating the transistor). The drains of the transistors 54 and 56 are also respectively common with first terminals of distributed capacitances 62 and 64, the second terminals of which receive a suitable negative voltage such as approximately two and three fourths volts (−2.75 V.) from a voltage source 66. The distributed capacitances 62 and 64 are shown in broken lines in FIG. 2 to indicate that they are not tangible components but are respectively formed from distributed capacitances within various components including the transistors 58 and 60. Switches 68 and 70 are respectively connected across the distributed capacitances 62 and 64. The switches 68 and 70 may be formed from transistors. The switches 68 and 70 may have parasitic capacitances which contribute to the values of the distributed capacitances 62 and 64.

The sources of the transistors 58 and 60 may receive the negative potential of two and three fourths voltage (−2.75 V.) from the voltage source 66. Connections are respectively made from the drains of the transistors 58 and 60 to the gates of the transistors 60 and 58. The gates of the transistors 58 and 60 are also respectively connected to the sources of transistors 72 and 74, which may be of the p-type. The gates of the transistors 72 and 74 receive the negative potential of two and three fourths volts (−2.75 V.) from the voltage source 66. The voltages on the drains of the transistors 72 and 74 are respectively introduced to output lines 78 and 80. Switches 82 and 84 are respectively connected between the lines 78 and 80 and the source 66 of the negative voltage such as two and three fourths volts (−2.75 V.). The switches 82 and 84 may be formed from transistors.

The constant current on the line 50 is divided between the transistors 54 and 56 in accordance with the relative magnitudes of the input voltage introduced to the gate of the transistor 54 and the reference voltage introduced to the transistor 56. For example, the current through the transistor 54 exceeds the current through the transistor 56 when the magnitude of the input voltage is less than the magnitude of the reference voltage. The currents through the transistors 54 and 56 respectively charge the distributed capacitances 62 and 64.

When the charges on the distributed capacitances 62 and 64 reach a particular value, the transistors 58 and 60 become conductive. Current accordingly flows through a first circuit including the current source 52, the transistor 54, the transistor 60 and the distributed capacitance 62. Current simultaneously flows through a circuit including the current source 52, the transistor 56, the transistor 58 and the distributed capacitance 64.

When the magnitude of the charge in the distributed capacitance 62 is greater than the magnitude of the charge in the distributed capacitance 64, the current flowing through the transistor 58 is greater in magnitude than the current flowing through the transistor 60. This causes the charging of the distributed capacitance 62 to be accelerated relative to the charging of the distributed capacitance 64. Because of the difference between the accelerated charging of the capacitances 62 and 64, the difference between the currents in the transistors 58 and 60 becomes increasingly pronounced with progressions in time. As a result, the difference in the magnitudes of the voltage across the capacitance 62 relative to the magnitude of the voltage across the capacitance 64 becomes progressively accelerated.

The voltages on the gates of the transistors 72 and 74 have the same constant value. This causes the conductivity of the transistors 72 and 74 to be dependent upon the magnitudes of the voltages on the sources of the transistors. When the magnitude of the voltage on the source of each of the transistors 72 and 74 has reached a particular value, that particular transistor becomes conductive. The magnitudes of the voltages on the sources of the transistors 72 and 74 are respectively dependent upon the charges across the capacitances 62 and 64.

Since one of the capacitances 62 and 64 becomes charged at a considerably more rapid rate than the other capacitance, one of the transistors 72 and 74 will become conductive considerably before the other transistor. For example, in the example above, the rapid charging of the capacitance 62 causes the transistor 72 to become conductive considerably before the transistor 74. This causes an output voltage to be produced on the output line 78 to indicate that the magnitude of the input voltage on the line 10 in FIG. 1 is greater than the magnitude of the reference voltage introduced to the comparator.

The operation of the switches 68 and 70 and the switches 82 and 84 is synchronized with the operation of the comparator 12a in FIG. 2. When an output signal is to be produced by the comparator 12a shown in FIG. 2, the switches 68, 70, 82 and 84 are opened to provide for the charging of the capacitances 62 and 64 and the production of the output voltage on one of the lines 78 and 80. The switches 68 and 70 are closed to discharge the capacitances 62 and 64 when no output voltage is to be produced on the output lines 78 and 80. At the same time, the switches 82 and 84 are closed to insure that no output voltage can be produced on the lines 78 and 80.

FIG. 3 illustrates voltages at strategic terminals in the flash comparator shown in FIG. 2. In FIG. 3, the production of the progressive magnitudes of the charges on the capacitances 62 and 64 is illustrated when the capacitance 62 is charged faster than the capacitance 64. As will be seen, the capacitance 62 may be charged at a slightly faster rate than the capacitance 64 until the charge in the capacitance 62 reaches a first particular magnitude. The relative charges in the capacitances 62 and 64 are respectively illustrated at 100 and 102. The first particular magnitude is indicated at 104.

When the charge in the capacitance 62 reaches the magnitude 104, the charging of the capacitance becomes accelerated as indicated at 106. Upon the occurrence of a charge in the capacitance 62 with a second particular magnitude 108, an output signal is produced on the line 78. This voltage is introduced to the "nand" network 18a since the switch 82 is open at that time.

The analog-to-digital converter discussed above has certain important advantages. The flash comparators 12 such as the comparator 12a shown in FIG. 2 operate on an accelerated basis to provide an output on one of the lines 78 and 80. This output is produced on a non-strobed basis. This is in contrast to the strobed basis generally provided in the prior art. The outputs of the comparators such as the comparator 12a in FIG. 2 are then introduced to the "nand" gates such as the "nand" gates 18a, 18b, 18c, etc.

As soon as a signal passes through one of the "nand" gates 18a, 18b, 18c, etc. to define that the magnitude of the input voltage on the line 11 is between the magnitudes of the reference voltages introduced to two progressive comparators such as the comparators 12b and 12c, the associated "nand" gate such as the "nand" gate 18b passes a signal. This signal passes through the "or" gate 22 and causes the data processing system to process the binary coded signals representing the magnitude of the input signal on the line 11.

Since the comparator 12a, 12b, 12c, etc. operate on a self-timed basis, each comparator provides an output only when that comparator has reached a clear definition of the relative magnitudes of the input voltage and the reference voltage introduced to the comparator. This is in contrast to the prior art since the prior art strobes the comparators even when the comparators are in a metastable state and are accordingly not ready to provide a definitive output.

The converter of this invention is able to provide definitive outputs in a time less than five (5) regeneration time constants for normal operation. As will be seen, this is considerably shorter than a time of approximately thirty (30) regenerative time constants required in the prior art. This considerably decreased time constant is obtained in applicant's converter without any increase in the complexity of the converter and without any increase in the amount of energy to operate the converter.

It may sometimes occur that a converter is not able to provide a definitive output within a particular time such as a time constant of thirty (30). In such an instance, the comparators such as that shown in FIG. 2 may be strobed by the back up clock 26 at a particular time constant such as a time equal to thirty (30) time constants to provide an output. As will be appreciated, this is quite rare. For example, such an occurrence is less than once (1) in a million conversion cycles As will be appreciated, it is desired to strobe the comparator as infrequently as possible since inconclusive results are often obtained from the comparator when the comparator is strobed.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

We claim:

1. In combination,
a source of a constant current,
first means for providing an input voltage,
second means for providing a reference voltage,
third means responsive to the relative characteristics of the input voltage and the reference voltage for producing a flow of a first portion of the constant current in accordance with the relative characteristics of the input voltage and the reference voltage,
fourth means responsive to the relative characteristics of the reference voltage and the input voltage for producing a flow of the remaining portion of the constant current,
fifth means responsive to the first portion of the constant current for providing a first charge dependent upon the magnitude of such first portion,
sixth means responsive to the remaining portion of the constant current for providing a second charge dependent upon the magnitude of such remaining portion,
seventh means for accelerating the rate of producing an individual one of the first and second charges, and for decelerating the rate of producing the other one of the first and second charges, in accordance with the relative magnitudes of the first and second charges, and
eight means for providing an output indication when such individual one of the charges has reached a particular magnitude.

2. In a combination as set forth in claim 1,
a plurality of second means each providing a reference voltage of a progressive magnitude,
a plurality of third through eighth means, the third through eighth means in each plurality being associated with one of the second means in the plurality and having a relationship as recited in claim 1, and
ninth means for connecting successive pairs of the eighth means in a relationship to indicate an identity between the magnitudes of the input voltage and an individual one of the reference voltages of progressive magnitudes.

3. In a combination as set forth in claim 2,
the ninth means including a plurality of "nand" networks each connected to an individual one of the successive pairs of the eighth means and further including an "or" network connected to the "nand" networks in the plurality.

4. In a combination as set forth in claim 1,
the seventh means including first and second switching means each having open and closed states and each normally operative in the open state and each operative in the closed state upon the occurrence of a second particular magnitude in the associated one of the first and second charges to accelerate the rate at which the magnitude of the associated one of the first and second charges is produced.

5. In combination,
a source of a constant current,
means for providing an input voltage,
means for providing a reference voltage,
first and second capacitances,
means for dividing the constant current between the first and second capacitances in accordance with the relative values of the input and reference voltages,
means responsive to a first particular charge in an individual one of the first and second capacitances for accelerating the charging of such individual one of the capacitances and for decelerating the charging of the other one of the capacitances, and
means responsive to a second particular charge in the individual one of the first and second capacitances for indicating the relative magnitudes of the input and reference voltages, the second particular charge being greater than the first particular charge.

6. In a combination as set forth in claim 5,
the accelerating-deceleration means including a first pair of transistors each connected to an associated one of the first and second capacitances to become conductive in accordance with the charge in the associated capacitance and to provide for a accelerated build-up of charge in the associated capacitance in accordance with its conductivity and each cross connected to the other one of the first and second capacitances to decelerate the build-up of charge in the other capacitance in accordance with the accelerated build-up of charge in the associated capacitance.

7. In a combination as recited in claim 5,
the reference voltage means providing a plurality of reference voltages of progressive magnitudes,
means for providing pluralities of first and second capacitances, the first and second capacitances in the plurality being paired,
means for dividing the constant current between the capacitances in the individual pairs in accordance with the relative values of the input voltage and the individual ones of the reference voltages of the progressive magnitude,
means responsive to the first particular charge in an individual one of the capacitances in each pair for accelerating the charging of such individual one of the capacitances in such pair and for decelerating the charging of the other one of the capacitances in such pair,
means responsive to the second particular charge in the individual one of the capacitances in each pair for determining the relative magnitudes of the input voltage and the reference voltage associated with that individual pair of capacitances, and
means responsive to the determinations of the relative magnitudes of the input voltage and the reference voltages in the plurality for indicating the magnitude of the input voltage.

8. In a combination as set forth in claim 7,
the indicating means including a plurality of "nand" networks each connected to an adjacent pair of the determining means to pass a signal dependent upon the relative determinations in the adjacent pair and further including an "or" network connected to the "nand" networks to pass the signals from the "nand" networks.

9. In combination
means for providing a constant current,
means for providing an input voltage,
means for providing a reference voltage,
first control means,
second control means,
the first and second control means being respectively responsive to the input voltage and the reference voltage for dividing the constant current between the first and second control means in accordance with the relative values of the input and reference voltages,
first and second capacitance means respectively connected to the first and second control means to become charges in accordance with the currents flowing through the first and second control means,
first and second feedback means respectively connected to the first and second capacitance means for accelerating the flow of current through the individual one of such capacitance means having the greater charge and for decelerating the flow of current through the other one of the capacitance means having the lesser charge, and
indicating means connected to the first and second capacitance means for indicating the relative values of the input voltage and the reference voltage when the charge on the individual one of the capacitances means reaches a particular value.

10. In a combination as set forth in claim 9,
the first and second control means respectively including first and second transistors, and
the first and second feedback means respectively including third and fourth transistors.

11. In a combination as set forth in claim 10,
each of the third and fourth transistors having input and output terminals, the input terminal of the third transistor being connected to the output terminal of the fourth transistor and the input terminal of the fourth transistor being connected to the output terminal of the third transistor.

12. In a combination as set forth in claim 11,
each of the first and second transistors having first and second terminals, the first terminals of the first and second transistors respectively receiving the input voltage and the reference voltage and the second terminals of the first and second transistors receiving the constant current.

13. In a combination as set forth in claim 12,
the first and second transistors having third terminals, the third terminals of the first and second transistors being respectively connected to the output terminals of the third and fourth transistors.

14. In a combination as set forth in claim 13,
the input terminals of the third and fourth transistors being respectively connected to the first and second capacitance means to receive voltages in accordance with the charges across the first and second capacitance means.

15. In a combination as set forth in claim 14,
a pair of switching means each connected across an individual one of the capacitances and having open and closed states of operation and operative in the open state to provide for a charging of the associated capacitance and operative in the closed state to discharge the associated capacitance.

16. In combination,
means for providing an input voltage,
means for providing a reference voltage,
first and second transistors each having first, second and third terminals,
means for introducing the input voltage to the first terminal of the first transistor,
means for introducing the reference voltage to the first terminal of the second transistor,
means for introducing a constant current to the second terminals of the first and second transistors to obtain the flow of relative portions of the constant current through the first and second transistors in accordance with the relative values of the input and reference voltages,
first and second capacitance means respectively connected to the third terminals of the first and second transistors to become charged in accordance with the relative currents through the associated transistors, third and fourth transistors each having first, second and third terminals, the third terminal of the first transistor being connected to the first terminal of the fourth transistor and the second terminal of the third transistor, the third terminal of the second transistor being connected to the first terminal of the third transistor and the second terminal of the fourth transistor, and means connected to the third terminals of the first and second transistors for indicating the relative values of the input and reference voltages.

17. In a combination as set forth in claim 16, the first, second and third terminals of each of the first, second, third and fourth transistors respectively constituting the gate, the source and the drain of such transistor.

18. In a combination as set forth in claim 17, voltage means connected to the third terminals of the third and fourth transistors.

19. In a combination as set forth in claim 18, the indicating means constituting fifth and sixth transistors each having first, second and third terminals.

the first terminals of the fifth and sixth transistors being connected to the voltage means, the second terminals of the fifth and sixth transistors being respectively connected to the third terminals of the first and second transistors, the output indications being obtained from the third terminals of the fifth and sixth transistors.

20. In a combination as set forth in claim 19, first and second switches respectively connected across the first and second capacitances, each of the first and second switches having open and closed states and being simultaneously operative in either the open or closed states.

* * * * *